United States Patent
Tseng et al.

(10) Patent No.: US 9,882,002 B2
(45) Date of Patent: Jan. 30, 2018

(54) FINFET WITH AN ASYMMETRIC SOURCE/DRAIN STRUCTURE AND METHOD OF MAKING SAME

(71) Applicant: Taiwan Semiconductor Manufacturing Company, Ltd., Hsin-Chu (TW)

(72) Inventors: Hsiang-Jen Tseng, Hsin-Chu (TW); Ting-Wei Chiang, New Taipei (TW); Wei-Yu Chen, Hsin-Chu (TW); Kuo-Nan Yang, Hsin-Chu (TW); Ming-Hsiang Song, Shin-Chu (TW); Ta-Pen Guo, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/987,351

(22) Filed: Jan. 4, 2016

(65) Prior Publication Data
US 2016/0118462 A1  Apr. 28, 2016

Related U.S. Application Data

(63) Continuation of application No. 13/790,814, filed on Mar. 8, 2013, now Pat. No. 9,231,106.

(51) Int. Cl.
*H01L 29/78* (2006.01)
*H01L 21/336* (2006.01)
(Continued)

(52) U.S. Cl.
CPC ........ *H01L 29/0847* (2013.01); *H01L 21/283* (2013.01); *H01L 21/30604* (2013.01); *H01L 21/823418* (2013.01); *H01L 21/823431* (2013.01); *H01L 21/823814* (2013.01); *H01L 21/845* (2013.01); *H01L 27/0886* (2013.01); *H01L 27/0924* (2013.01); *H01L 29/41758* (2013.01); *H01L 29/6656* (2013.01); *H01L 29/6681* (2013.01); *H01L 29/66477* (2013.01); *H01L 29/66545* (2013.01);
(Continued)

(58) Field of Classification Search
CPC ............ H01L 29/66795; H01L 29/785; H01L 21/823431; H01L 27/0886; H01L 21/845; H01L 27/1211; H01L 21/823821; H01L 27/0924; H01L 29/7848; H01L 29/66636
See application file for complete search history.

(56) References Cited

U.S. PATENT DOCUMENTS

2006/0091498 A1* 5/2006 Sriram ................ H01L 29/0692
  257/578
2008/0179635 A1* 7/2008 Gossner ............ H01L 29/41758
  257/241

(Continued)

*Primary Examiner* — Victor A Mandala
*Assistant Examiner* — Regan J Rundio
(74) *Attorney, Agent, or Firm* — Slater Matsil, LLP

(57) ABSTRACT

Embodiments of the present disclosure are a semiconductor device, a FinFET device, and a method of forming a FinFET device. An embodiment is a semiconductor device comprising a first semiconductor fin extending above a substrate, a first source region on the first semiconductor fin, and a first drain region on the first semiconductor fin. The first source region has a first width and the first drain region has a second width with the second width being different than the first width.

20 Claims, 11 Drawing Sheets

(51) Int. Cl.
*H01L 27/088* (2006.01)
*H01L 27/092* (2006.01)
*H01L 21/8234* (2006.01)
*H01L 21/8238* (2006.01)
*H01L 21/84* (2006.01)
*H01L 21/20* (2006.01)
*H01L 29/66* (2006.01)
*H01L 29/08* (2006.01)
*H01L 21/283* (2006.01)
*H01L 21/306* (2006.01)
*H01L 29/417* (2006.01)

(52) U.S. Cl.
CPC ...... *H01L 29/66795* (2013.01); *H01L 29/785* (2013.01); *H01L 29/7835* (2013.01)

(56) References Cited

U.S. PATENT DOCUMENTS

| | | |
|---|---|---|
| 2008/0283925 A1 | 11/2008 | Berthold et al. |
| 2009/0065869 A1 | 3/2009 | Ohguro et al. |
| 2010/0102389 A1 | 4/2010 | Muller et al. |
| 2011/0095378 A1* | 4/2011 | Lee ................... H01L 29/41791 257/401 |
| 2011/0127610 A1* | 6/2011 | Lee ................. H01L 21/823431 257/365 |
| 2011/0147840 A1 | 6/2011 | Cea et al. |
| 2011/0147842 A1* | 6/2011 | Cappellani ........ H01L 21/26506 257/365 |
| 2011/0193141 A1* | 8/2011 | Lin ....................... H01L 29/045 257/255 |
| 2013/0049115 A1 | 2/2013 | Cheng et al. |
| 2013/0065371 A1* | 3/2013 | Wei ................... H01L 21/76224 438/294 |
| 2013/0277752 A1* | 10/2013 | Glass .............. H01L 21/823821 257/369 |
| 2013/0320399 A1 | 12/2013 | Chang et al. |
| 2014/0110756 A1* | 4/2014 | Zhu ................... H01L 29/66545 257/192 |
| 2014/0239420 A1 | 8/2014 | Basker et al. |

* cited by examiner

FINFET WITH AN ASYMMETRIC SOURCE/DRAIN STRUCTURE AND METHOD OF MAKING SAME

This application is a continuation of U.S. patent application Ser. No. 13/790,814, entitled "FinFET with an Asymmetric Source/Drain Structure and Method of Making Same," filed on Mar. 8, 2013, which application is hereby incorporated herein by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
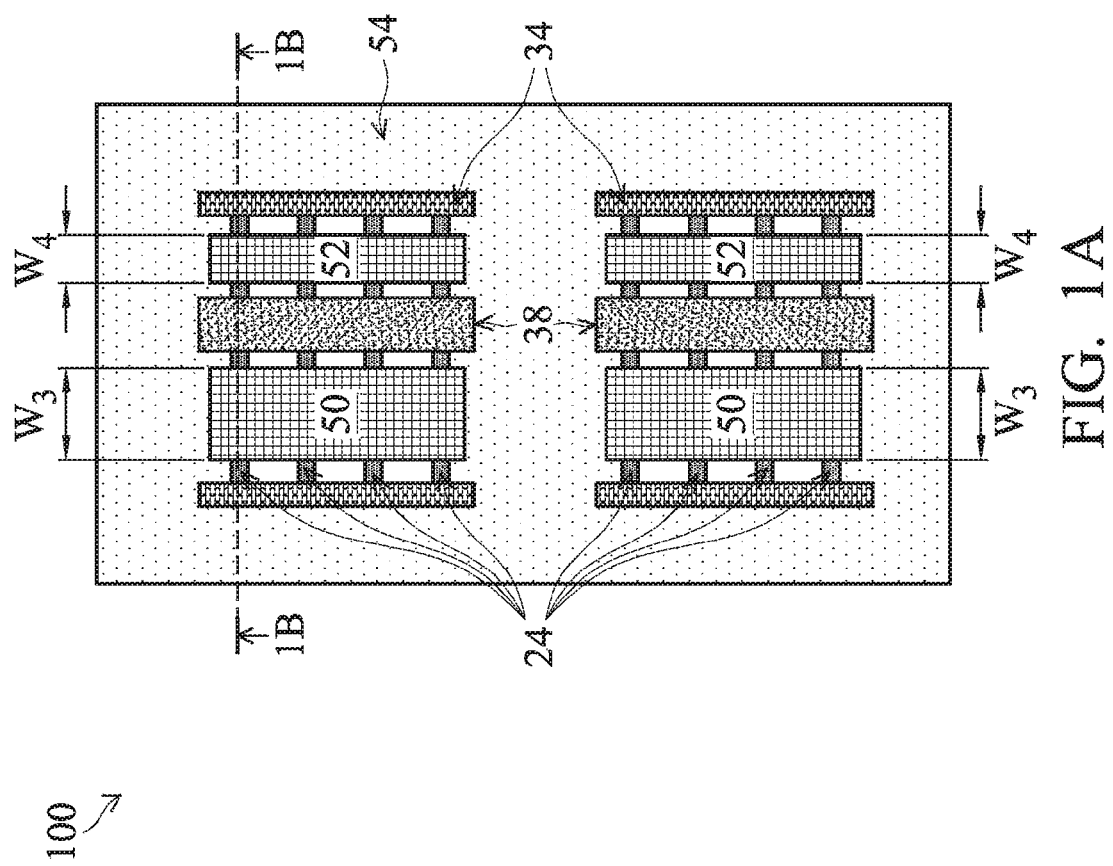
FIGS. 1A and 1B illustrate a top-down and cross-sectional view of a FinFET device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a FinFET device with an asymmetric source and drain structure. Other embodiments may also be applied, however, to other transistor devices with a goal of increased speed and/or reduced parasitic resistance.

Figure 1B:
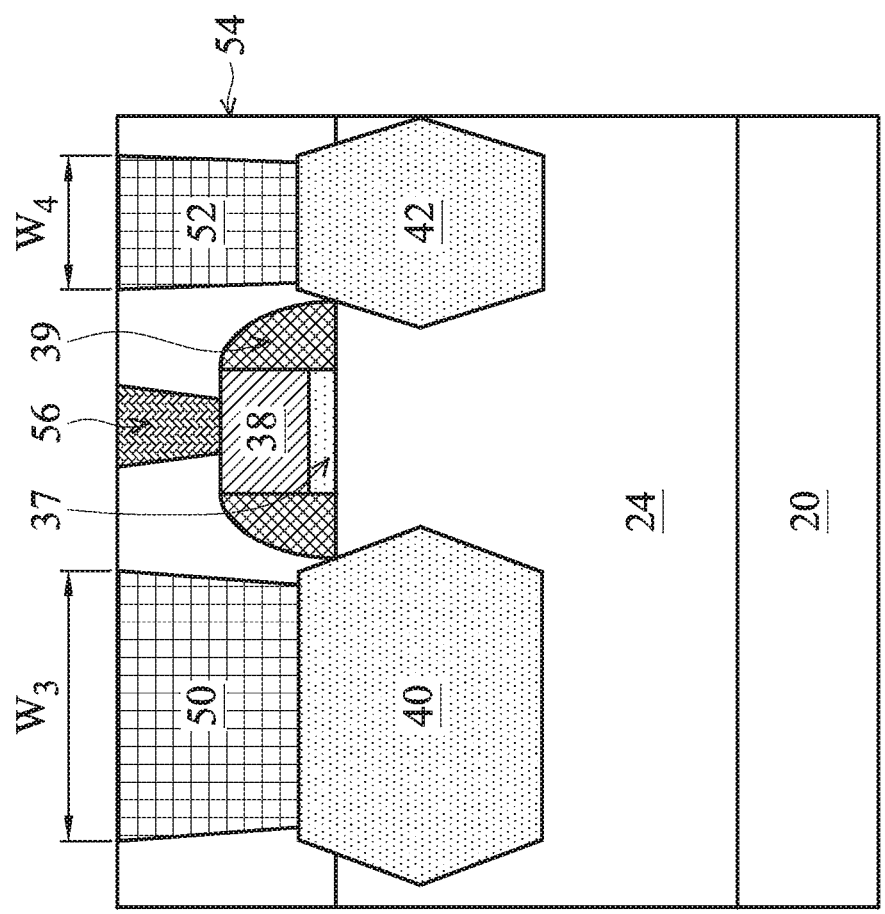

FIGS. 1A and 1B illustrate a top-down view and a cross-sectional view, respectively, of a FinFET device 100 at an intermediate stage of processing. The FinFET device 100 includes a plurality of semiconductor fins 24 extending above a semiconductor substrate 20 and disposed in a dielectric layer 22 (see FIG. 3). The FinFET device 100 further includes gates 38 and gate dielectric layers 37 over the semiconductor fins, source regions 40 and drain regions 42 on the semiconductor fins 24 (see FIG. 1B), source contacts 50, drain contacts 52, gate contacts 56, and structures 34. The source contacts 50 and the drain contacts 52 are formed over and in electrical contact with the source regions 40 and the drain regions 42, respectively. The source contacts 50 and the drain contacts 52 may electrically couple the source regions 40 and the drain regions 42, respectively, to external devices and/or subsequently formed layers.

As shown in FIGS. 1A and 1B, the source regions 40 are wider than the drain regions 42 and the source contacts 50 are wider than the drain contacts 52. By having the source regions 40 and the source contacts 50 wider than the drain regions 42 and the drain contacts 52, the parasitic resistance of the source structure (40 and 50) may be reduced which may increase the speed of the FinFET device 100.

Figure 2:
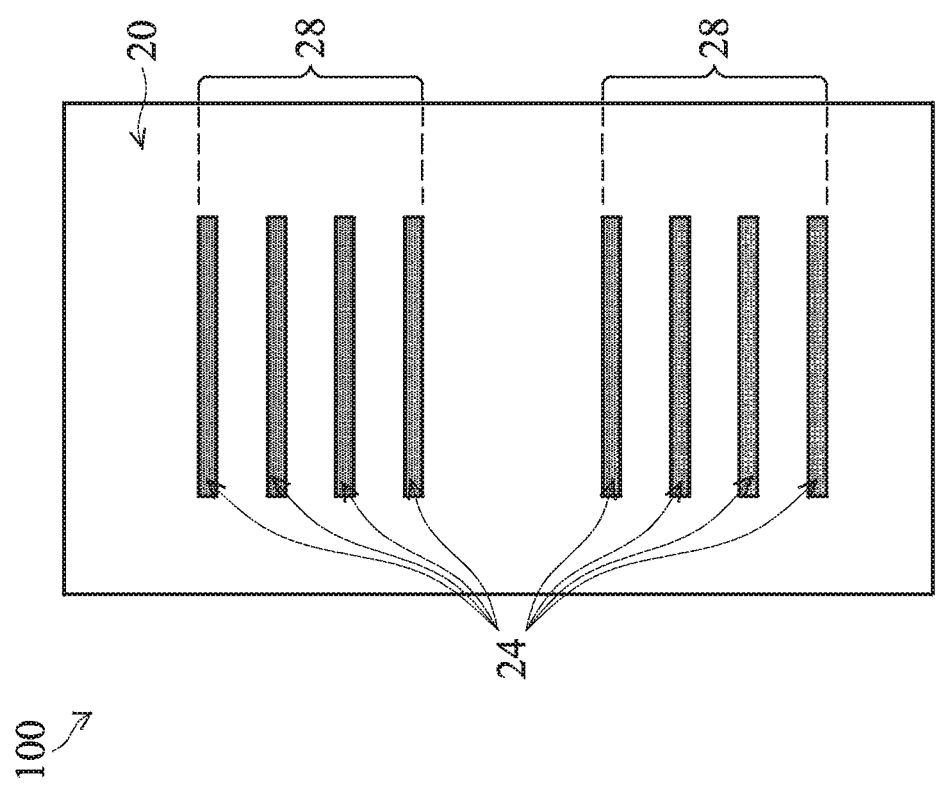
FIGS. 2 through 6B illustrate in top-down and cross-sectional views various stages of manufacture of a FinFET device according to an embodiment.

FIGS. 2 through 6B illustrate the formation of the FinFET device 100. As shown in FIG. 2, FinFET device 100 may include two groups 28 of semiconductor fins 24. Although each group 28 is shown to have fours semiconductor fins 24, this is an illustrative embodiment and more or less semiconductor fins 24 are within the scope of the present disclosure.

FIG. 2 illustrates the patterning of the semiconductor fins 24 over the semiconductor substrate 20. The semiconductor substrate 20 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 20 may include active devices (not shown in FIG. 2). As one of ordinary skill in the art will recognize, a wide variety of devices such as transistors, capacitors, resistors, combinations of these, and the like may be used to generate the structural and functional requirements of the design for the FinFET device 100. The devices may be formed using any suitable methods. The semiconductor fins 24 may be electrically coupled to the active and passive devices. Only a portion of the semiconductor substrate 20 is illustrated in the figures, as this is sufficient to fully describe the illustrative embodiments.

In an embodiment, the semiconductor fins 24 may be formed by patterning the semiconductor substrate 20. The patterning process may be accomplished by depositing mask material (not shown) such as photoresist or silicon oxide over the semiconductor substrate 20. The mask material is then patterned and the semiconductor substrate 20 is etched in accordance with the pattern. The resulting structure includes a plurality of semiconductor fins 24 formed on the semiconductor substrate 20. Each of the plurality of semiconductor fins 24 has a sidewall being substantially orthogonal to a top surface of the semiconductor substrate 20. In some embodiments, the semiconductor substrate 20 is etched to a specific depth, meaning the semiconductor fins 24 are formed to a height, the semiconductor fins 24 may have a height from about 1 nm to about 500 nm. In one specific embodiment, the semiconductor fins 24 are formed to have a height of about 110 nm. The semiconductor fins 24 may have a width from about 1 nm to 100 nm. The semiconductor fins 24 may have a length from about 0.01 um to 10 um. In an alternative embodiment, the semiconductor fins 24 may be epitaxially grown from a top surface of the semiconductor substrate 20 within trenches or openings formed in a patterned layer (e.g. a dielectric layer) atop the semiconductor substrate 20. Because the process is known in the art, the details are not repeated herein.

The semiconductor fins 24 may be formed of semiconductor material such as silicon, germanium, silicon germanium, or the like. In an embodiment, the semiconductor fins 24 are silicon. The semiconductor fins 24 may then doped through an implantation process to introduce p-type or n-type impurities into the semiconductor fins 24.

Figure 3:
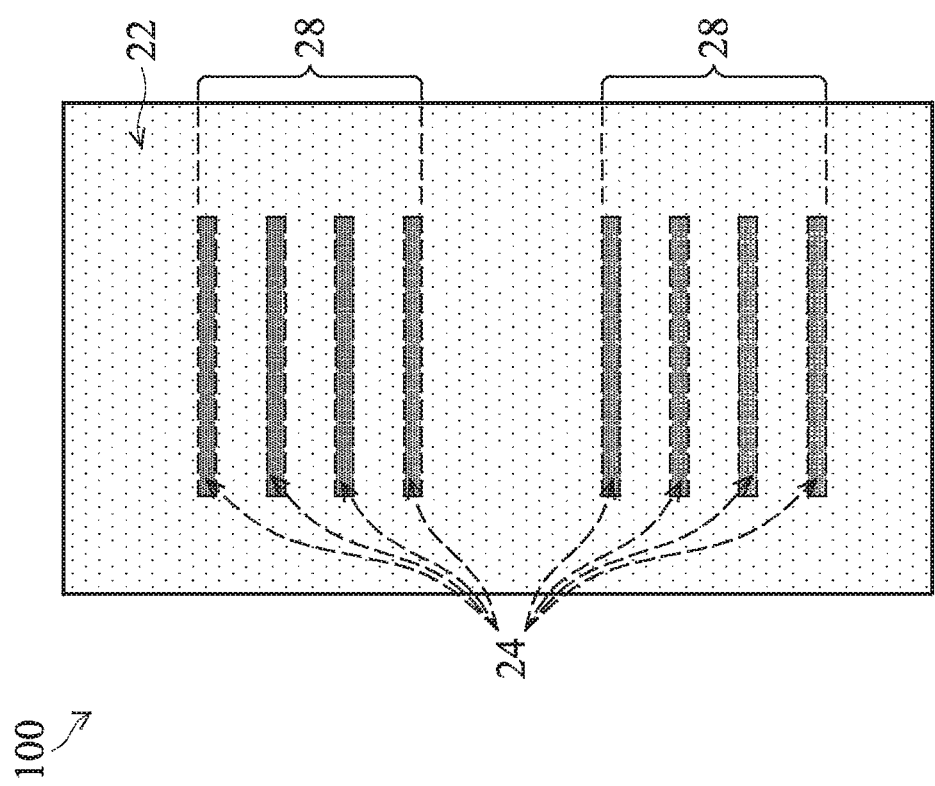

FIG. 3 illustrates the forming of a dielectric layer 22 over the semiconductor substrate 20 and the semiconductor fins 24. The dielectric layer 22 may blanket deposited on the FinFET device 100. The dielectric layer 22 may be made of one or more suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. The dielectric layer 22 may be deposited through a process such as chemical vapor deposition (CVD), or a spin-on-glass process, although any acceptable process may be utilized.

Figure 4:
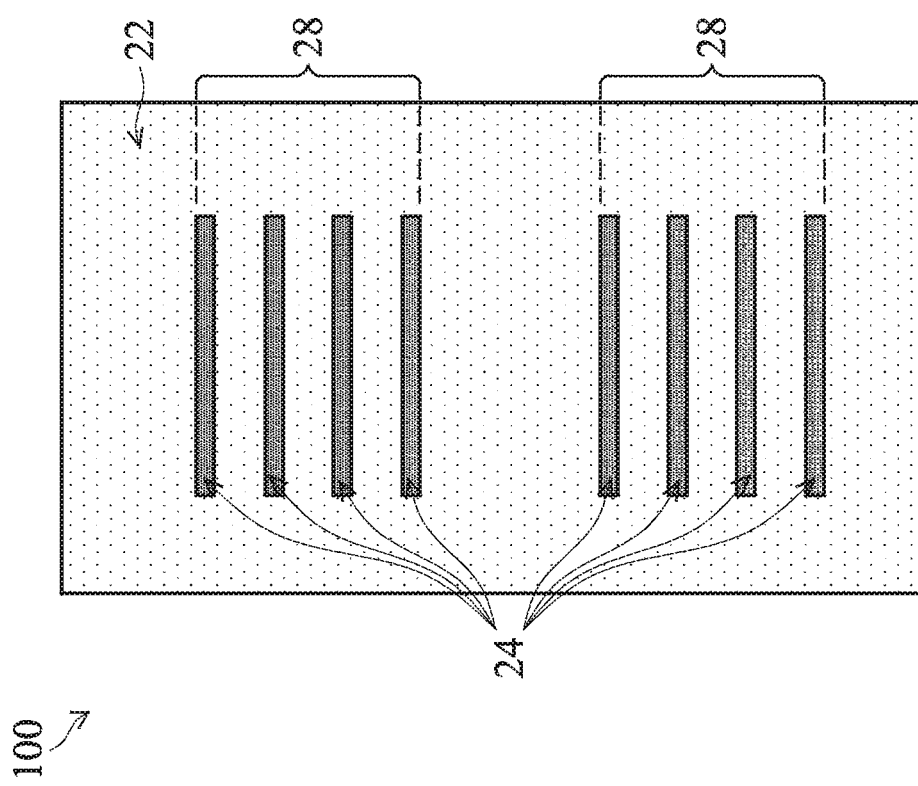

FIG. 4 illustrates the next step in the manufacturing process, wherein the dielectric layer 22 is thinned to below the level of the tops of the semiconductor fins 24. The dielectric layer 22 may be thinned back in a variety of ways. In one embodiment, this is a multi-step process with the first step involving a chemical mechanical polishing (CMP), in which the dielectric layer 22 is reacted and then ground away using an abrasive. This process may continue until the tops of the semiconductor fins 24 are exposed. The next step of thinning the dielectric layer 22 below the tops of the semiconductor fins 24 may be performed in a variety of ways. One such way is by a diluted hydrofluoric acid (DHF) treatment or a vapor hydrofluoric acid (VHF) treatment for a suitable time. In another embodiment, the CMP process step may be skipped and the dielectric layer 22 may be selectively thinned back without removing the semiconductor fins 24. This selective thinning may be performed by the DHF treatment or the VHF treatment described above.

Figure 5A:
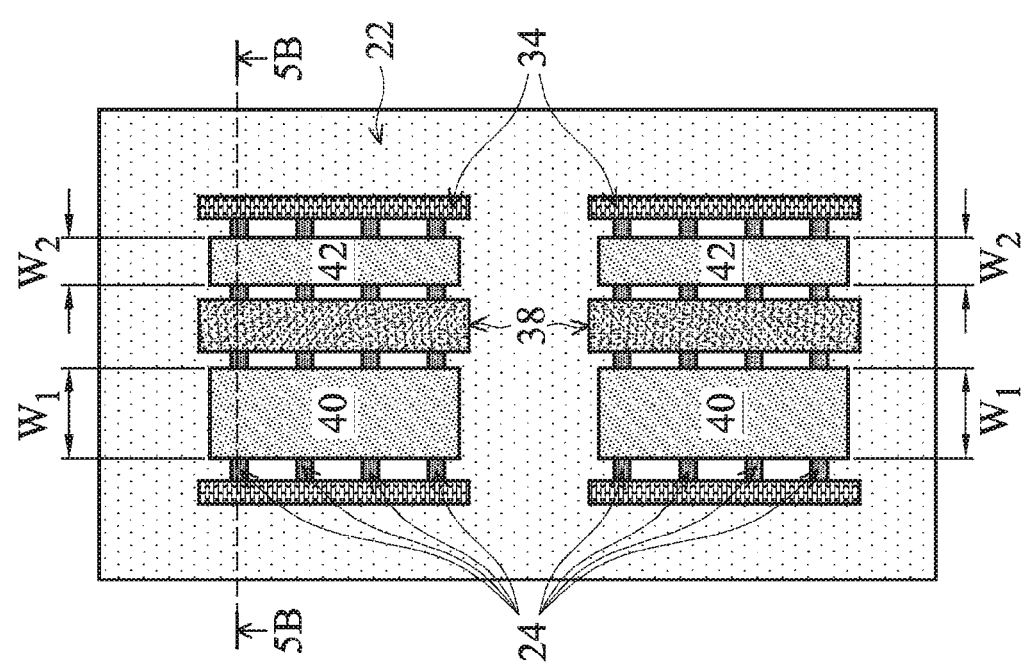
Figure 5B:
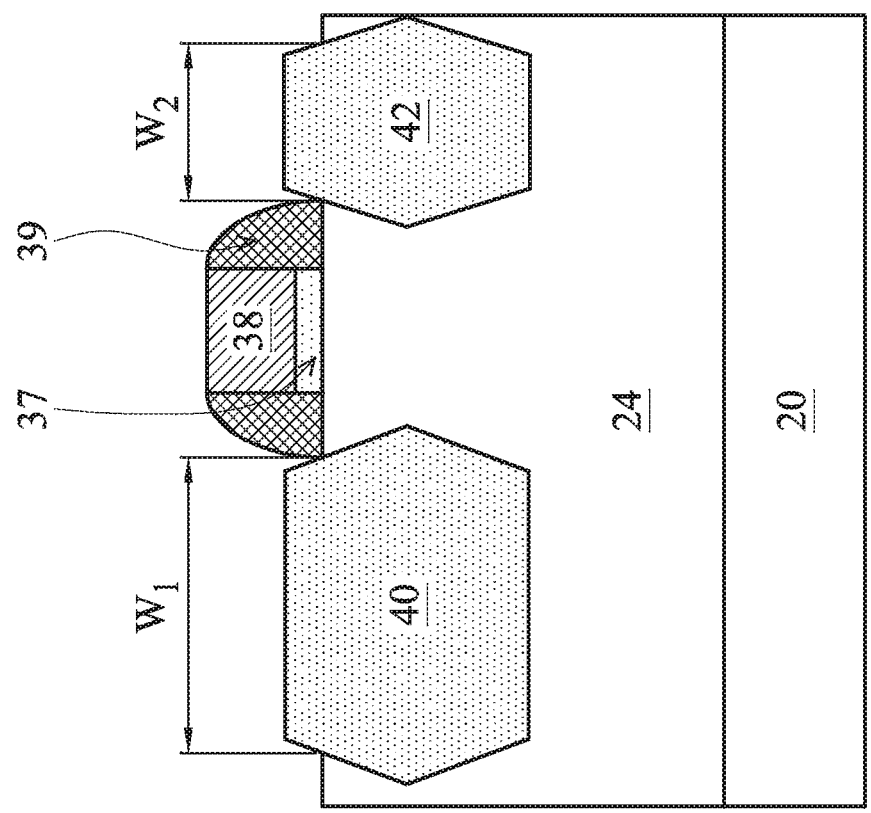

FIGS. 5A and 5B illustrate the formation of the gates 38 over the semiconductor fins 24, the source regions 40 and the drain regions 42 on the semiconductor fins 24, and the structures 34 on the ends of the semiconductor fins 24. The gates 38 may include a gate dielectric layer 37 and gate spacers 39. The gate dielectric 37 layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include metal oxides such as oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, the like, or combinations and multi-layers thereof. In an embodiment, the gate dielectric layer 37 is a high-k dielectric layer with a thickness from about 5 angstroms to about 30 angstroms.

The gate electrode layer may be formed over the gate dielectric layer 37. In an embodiment, the gate electrode layer may be a doped poly-silicon with a uniform or non-uniform doping. In another embodiment, the gate electrode layer may comprise an n-type work function metal. An n-type work function metal may comprise a W, Cu, Ti, Ag, Al, TiAl, TiAlN, TaC, TaCN, TaSiN, Mn, Zr, the like, or a combination thereof. In another embodiment, the gate electrode layer may comprise a p-type work function metal. A p-type work function metal may comprise TiN, WN, TaN, Ru, the like, or a combination thereof. In an embodiment, the gate electrode layer may be formed to have a thickness from about 20 nm to about 60 nm. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer 37 may be patterned to form the gates 38. The gate patterning process may be accomplished by depositing mask material (not shown) such as photoresist or silicon oxide over the gate electrode layer. The mask material is then patterned and the gate electrode layer is etched in accordance with the pattern. In an embodiment, the gates 38 on each group 28 of semiconductor fins 24 may be electrically coupled together to form a single gate 38 for both groups 28 of semiconductor fins 24.

The structures 34 may provide a structure to allow the epitaxial growth of the source regions 40 and the drain regions 42 to be controlled and/or confined. In an embodiment, the structures 34 may be dummy gates formed in a similar manner as described above for the gates 38, although any suitable structure may be utilized.

After the formation of the gates 38 and the structures 34, source regions 40 and the drain regions 42 may be formed on the semiconductor fins 24. The source regions 40 may be formed to have a width $W_1$ from about 30 nm to about 600 nm. The drain regions 42 may be formed to have a width $W_2$ from about 20 nm to about 400 nm. In an embodiment, the source regions 40 may be from about 1.2 to about 5 times wider than the drain regions 42. The source regions 40 and the drain regions 42 may be doped by performing implanting process to implant appropriate dopants to complement the dopants in the semiconductor fins 24. In another embodiment, the source regions 40 and the drain regions 42 may be formed by forming recesses (not shown) in semiconductor fins 24 and epitaxially growing material in the recesses. The source regions 40 and the drain regions 42 may be doped either through an implantation method as discussed above, or else by in-situ doping as the material is grown. In an embodiment, a continuous conductive layer may overly the four semiconductor fins 24 in each of the source regions 40 to form a single source region 40 in each group 28 of semiconductor fins 24. Further, a continuous conductive layer may overly the four semiconductor fins 24 in each of the drain regions 42 in each of the drain regions 42 to form a single drain region 42 in each of the groups 28 of semiconductor fins 24.

In the embodiment illustrated in FIGS. 5A and 5B, the FinFETs 28 may be configured in a PMOS or an NMOS configuration. In a PMOS configuration, the semiconductor fins 24 may be doped with n-type dopants and the source regions 40 and the drain regions 42 may be doped with p-type dopants. In an NMOS configuration, the semiconductor fins 24 may be doped with p-type dopants and the source regions 40 and the drain regions 42 may be doped with n-type dopants.

Gate spacers 39 may be formed on opposite sides of the gates 38. The gate spacers 39 are typically formed by blanket depositing a spacer layer (not shown) on the previously formed structure. The spacer layer may comprise SiN, oxynitride, SiC, SiON, oxide, the like, or a combination thereof and may be formed by methods utilized to form such a layer, such as CVD, plasma enhanced CVD, sputter, and other methods known in the art. The gate spacers 39 are then patterned, preferably by anisotropically etching to remove the spacer layer from the horizontal surfaces of the structure.

In another embodiment, the source regions 40 and the drain regions 42 may comprise a lightly doped region and a heavily doped region. In this embodiment, before the gate spacers 39 are formed, the source regions 40 and the drain regions 42 may be lightly doped. After the gate spacers are formed, the source regions 40 and the drain regions 42 may then be heavily doped. This forms lightly doped regions and heavily doped regions. The lightly doped regions are primarily underneath the gate spacers while the heavily doped regions are outside of the gate spacers along the semiconductor fins 24.

Figure 6A:
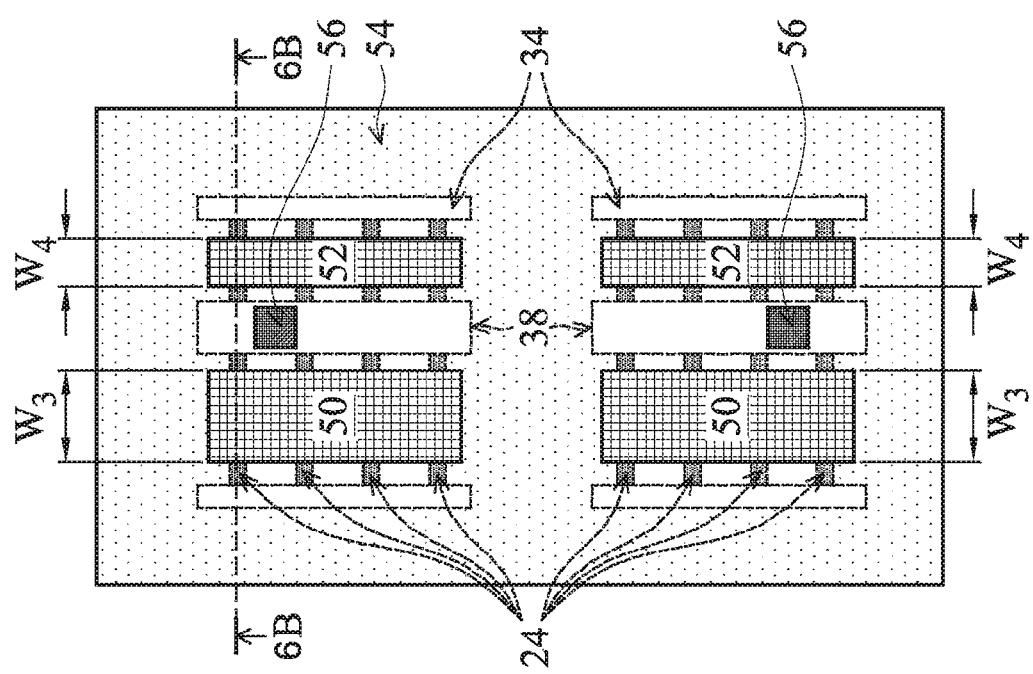
Figure 6B:
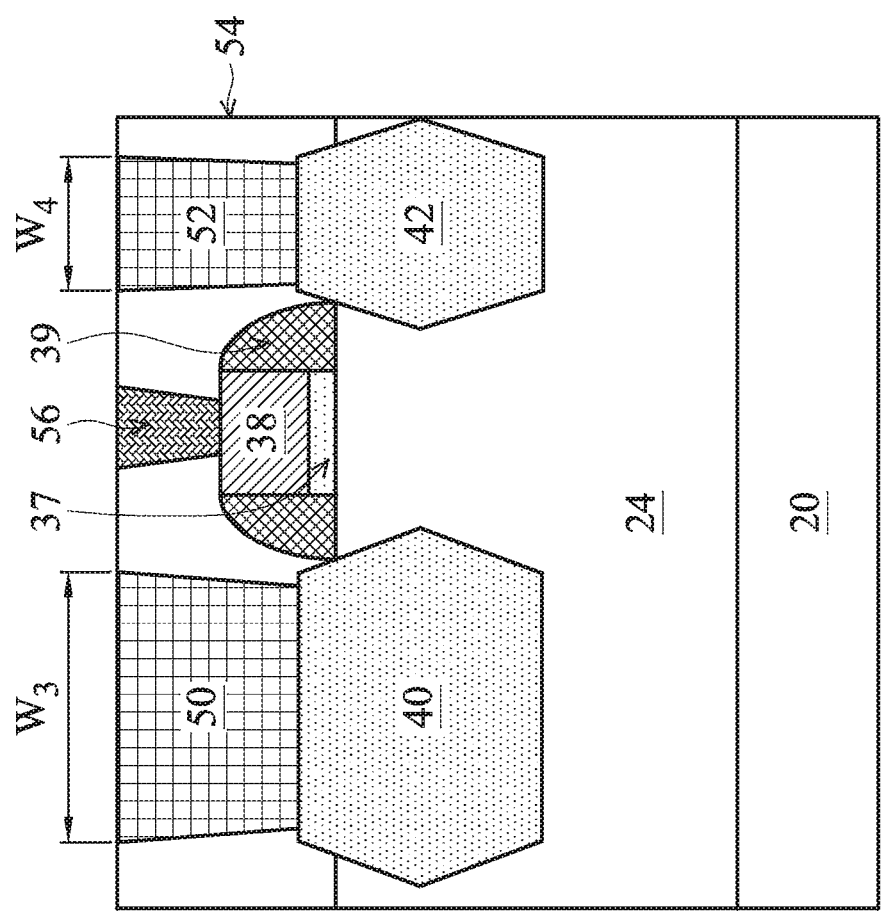

FIGS. 6A and 6B illustrate the formation the source contacts 50 over the source regions 40, the drain contacts 52 over the drain regions 42, and gate contacts 56 over the gates 38. The source contacts 50 may electrically couple the source regions 40 to a power node, a ground node, or active and/or passive devices (not shown). The drain contacts 52 may electrically couple the drain regions 42 to active and/or passive devices (not shown). The gate contacts 56 may electrically couple the gate 38 to a bias node to control the FinFET device 100.

The source contacts 50, the drain contacts 52, and the gate contacts 56 may be disposed in an inter-layer dielectric (ILD) 54. The source contacts 50 may be formed to have a width $W_3$ from about 15 nm to about 600 nm. The drain contacts 52 may be formed to have a width $W_4$ from about 10 nm to about 400 nm. In an embodiment, the source contacts 50 may be from about 1.2 to about 5 times wider than the drain contacts 52. The wider source structure (40 and 50) may reduce the parasitic resistance, and, thus, improve the performance of the FinFET device 100. Before the formation of the ILD 54, an etch stop layer (ESL) (not shown) may be formed over a top surface of the dielectric layer 22, the source regions 40, the drain regions 42, the gate 38, and the semiconductor fins 24. The ESL may be conformally deposited over components on the semiconductor substrate 20. The ESL, in an embodiment, is silicon nitride, silicon oxide, silicon carbide, the like, or a combination thereof. The ESL may be formed by CVD, flowable CVD, the like, or a combination thereof.

The ILD 54 may be formed over the ESL. The ILD 54, in an embodiment, is silicon oxide, a nitride, the like, or a combination thereof. The ILD 54 may be formed by CVD, a high density plasma (HDP), the like, or a combination thereof. Further, after depositing the ILD 54, the ILD 54 may be planarized, such as by using a CMP.

After the ILD 54 is formed, openings may be etched through the ILD 54 and the ESL to the source regions 40, the drain regions 42, and the gates 38. The openings can be etched using acceptable photolithography techniques, such a single or dual damascene process. It should be noted that acceptable photolithography techniques may use a first etchant to etch through the ILD 54 and a second etchant to etch through the ESL. Source contacts 50, drain contacts 52, and gate contacts 56 may then be formed in the openings. Forming the source contacts 50, drain contacts 52, and gate contacts 56 may include, for example, depositing a barrier layer such as titanium nitride, tantalum nitride, tungsten nitride, ruthenium, the like, or a combination thereof, and then depositing a conductive material, such as a metal like aluminum, copper, tungsten, the like, or a combination thereof, in the openings. The deposition may be by, for example, CVD, ALD, physical vapor deposition (PVD), the like, or a combination thereof. Excess barrier layer materials and/or conductive materials are removed, such as by CMP.

Figure 7:
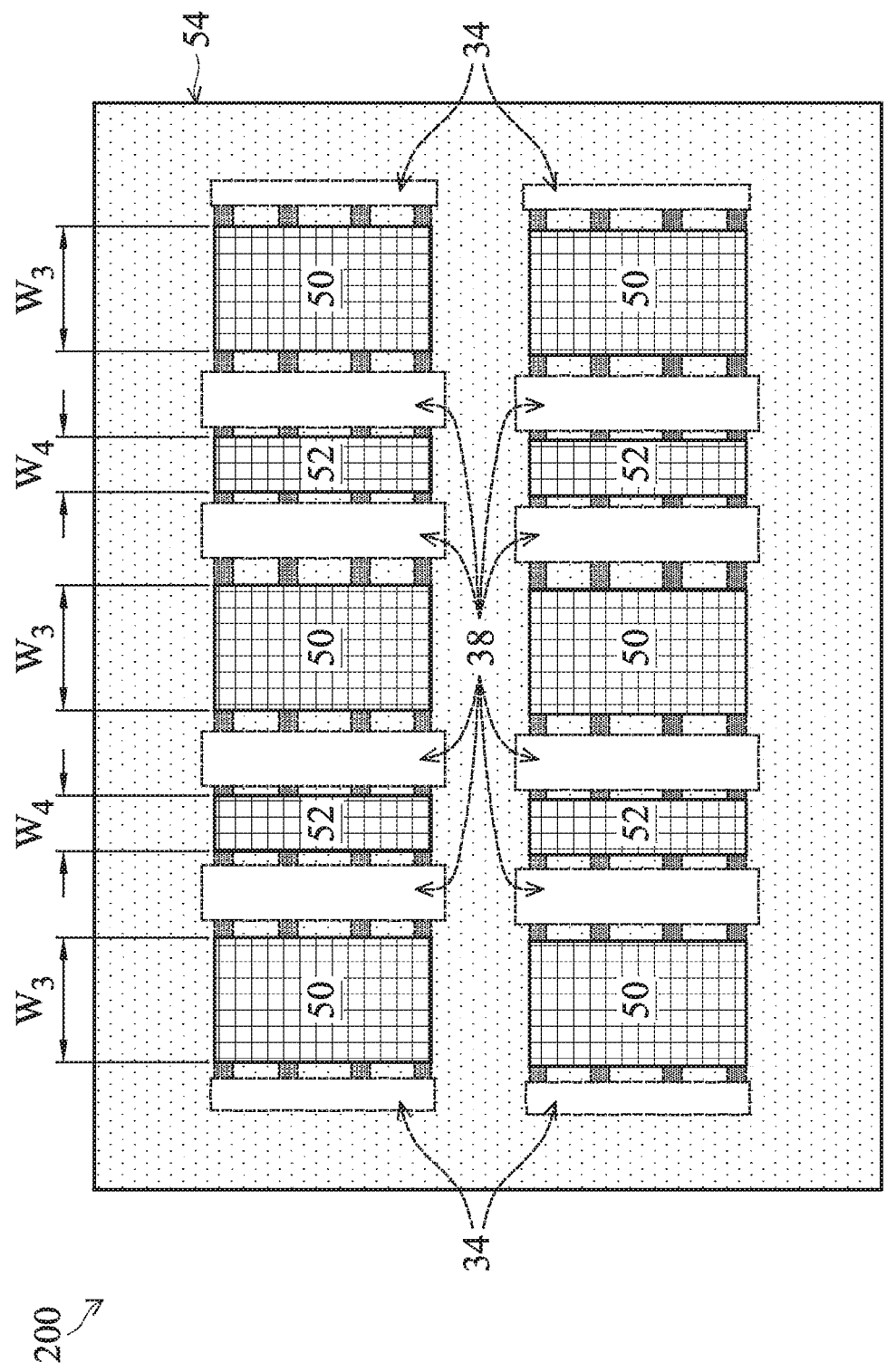
FIG. 7 illustrates in top-down view a FinFET device according to another embodiment.

FIG. 7 illustrates another embodiment of a FinFET device 200 wherein each group 28 of semiconductor fins 24 includes four gates 38, three source regions 40, three source contacts 50, two drain regions 42, and two drain contacts 52. This configuration may allow four separate transistors to be utilized with each gate 38 interposed between a source region 40 and a drain region 42. As discussed above, the source regions 40 may be formed to be wider than the drain regions 42. In an embodiment the source regions 40 may be from about 1.2 to about 5 times wider than the drain regions 42.

Figure 8:
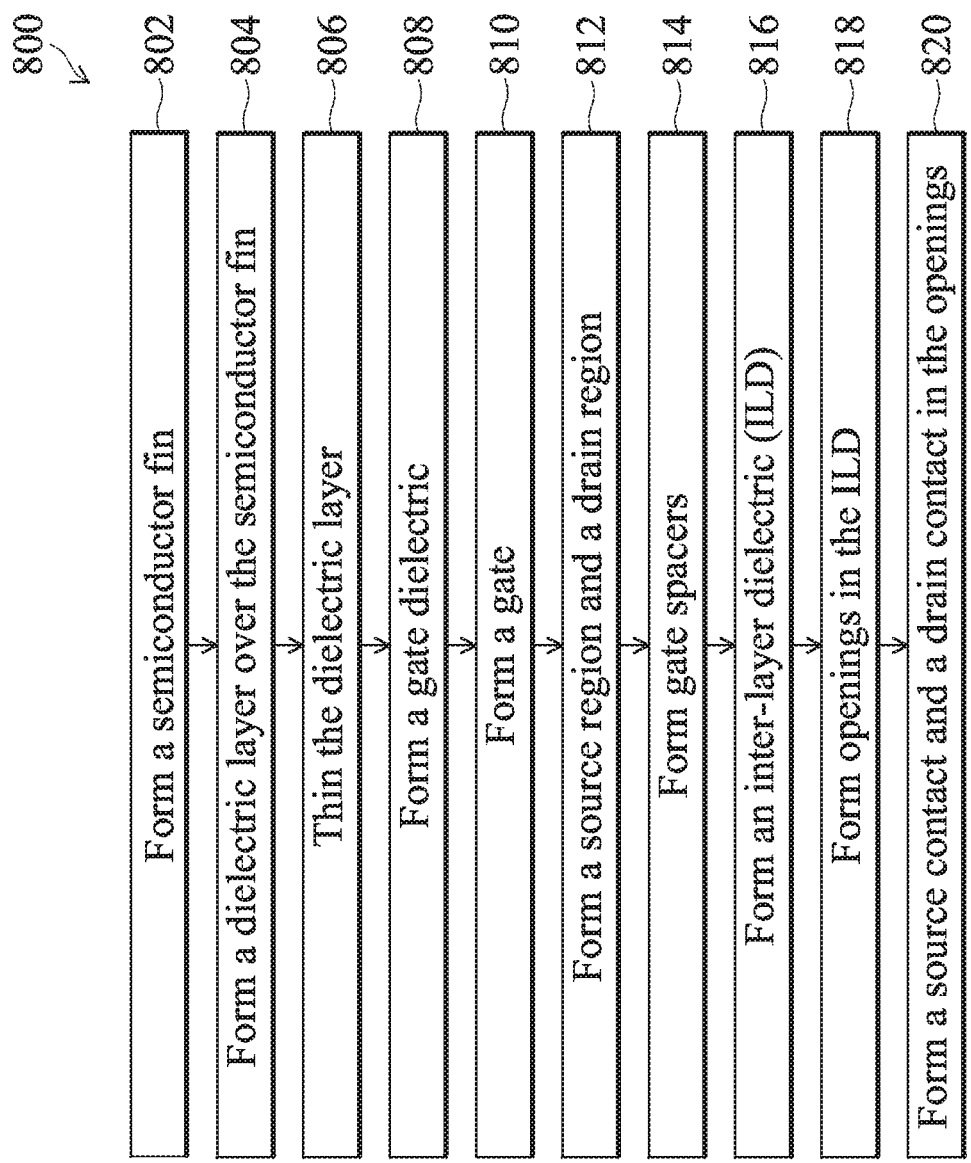
FIG. 8 illustrates a flow diagram of a method for manufacturing a FinFET device according to an embodiment.

FIG. 8 illustrates a flow diagram of a method 800 for manufacturing a FinFET device according to an embodiment. While method 800 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 802, a semiconductor fin is formed over a substrate. Step 802 is illustrated in FIG. 2.

At step 804, a dielectric layer is formed over the semiconductor fin. Step 804 is illustrated in FIG. 3.

At step 806, the dielectric layer is thinned to below the level of the top of the semiconductor fin. Step 806 is illustrated in FIG. 4.

At step 808, a gate dielectric layer is formed over the semiconductor fin. At step 810, a gate is formed over the semiconductor fin. At step 812, a source region and a drain region are formed on the semiconductor fin. At step 814, gate spacers are formed on opposite sides of the gate. Steps 808, 810, 812, and 814 are illustrated in FIGS. 5A and 5B.

At step 816, an ILD is formed over the semiconductor fin, the gate, the source region, the drain region, and the substrate. At step 818, openings may be formed in the ILD to the source region, the drain region, and the gate. At step 820, a source contact and a drain contact may be formed in the openings and over the source region and the drain region, respectively. Steps 816, 818, and 820 are illustrated in FIGS. 6A and 6B.

By forming the source regions 40 to be wider than the drain regions 42 and the source contacts 50 to be wider than the drain contacts 52, the parasitic resistance of the source structure (40 and 50) may be reduced which may increase the speed of the FinFET device 100. Experiments have shown that the source structure (40 and 50) is up ten times more sensitive to parasitic resistance than the drain structure (42 and 52). Thus, by reducing the parasitic resistance of the source structure (40 and 50), the speed of the FinFET device may be improved.

An embodiment is a semiconductor device comprising a first semiconductor fin extending above a substrate, a first source region on the first semiconductor fin, and a first drain region on the first semiconductor fin. The first source region has a first width and the first drain region has a second width with the second width being different than the first width.

Another embodiment is a FinFET device comprising a first plurality of fins extending above a substrate, a first source region on the first plurality of fins, the first source region having a first width, and a first drain region on the first plurality of fins, the first drain region having a second width. The FinFET device further comprises a first source contact over and electrically coupled to the first source region, the first source contact having a third width, and a first drain contact over and electrically coupled to the first drain region, the first drain contact having a fourth width, the fourth width being smaller than the third width.

Yet another embodiment is a method for forming a FinFET device, the method comprising forming a first semiconductor fin over a substrate, forming a first source region on the first semiconductor fin, forming a first drain region on the first semiconductor fin, and forming a first gate over the first semiconductor fin, the first gate being laterally between the first source region and the first drain region. The first source region has a first width and the first drain region has a second width, the second width being smaller than the first width.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
doping a first semiconductor fin with impurities of a first conductivity type;
etching a first recess in the first semiconductor fin;
epitaxially growing a first semiconductor material in the first recess to form a first source region, the first source region having a first width;
etching a second recess in the first semiconductor fin;
epitaxially growing a second semiconductor material in the second recess to form a first drain region, the first drain region having a second width, the second width being smaller than the first width;
forming a first active gate over the first semiconductor fin, the first active gate being laterally between the first source region and the first drain region, a doped portion of the first semiconductor fin below the first active gate and between the first source region and the first drain region forming a first channel region in the first semiconductor fin;
forming a first dummy gate over a first end of the first semiconductor fin, the first dummy gate being adjacent the first source region, the first dummy gate and the first active gate being separated by a first distance; and
forming a second dummy gate over a second end of the first semiconductor fin, the second dummy gate being adjacent the first drain region, the second end of the first semiconductor fin being opposite the first end, the second dummy gate and the first active gate being separated by a second distance, the second distance being less than the first distance.

2. The method of claim 1 further comprising:
forming a first source contact over and in electrical contact with the first source region, the first source contact having a third width; and
forming a first drain contact over and in electrical contact with the first drain region, the first drain contact having a fourth width, wherein the third width is larger than the fourth width.

3. The method of claim 2, wherein the third width is from about 1.2 to about 5 times larger than the fourth width.

4. The method of claim 1, wherein the first source region has a top surface above the top surface of the first semiconductor fin.

5. The method of claim 1, wherein the first width is from about 1.2 to about 5 times larger than the second width.

6. The method of claim 1 further comprising:
etching a third recess in a second semiconductor fin, the second semiconductor fin being parallel to the first semiconductor fin;
epitaxially growing the first semiconductor material in the third recess to form a second source region, the second source region having the first width;
etching a fourth recess in the second semiconductor fin;
epitaxially growing the second semiconductor material in the fourth recess to form a second drain region, the second drain region having the second width; and
forming a second active gate over the second semiconductor fin, the second active gate being laterally between the second source region and the second drain region.

7. The method of claim 6 further comprising:
forming a second source contact over and in electrical contact with the second source region, the second source contact having a fifth width; and
forming a second drain contact over and in electrical contact with the second drain region, the second drain contact having a sixth width, wherein the fifth width is larger than the sixth width.

8. The method of claim 6 further comprising:
forming a third dummy gate over a first end of the second semiconductor fin, the third dummy gate being adjacent the second source region; and
forming a fourth dummy gate over a second end of the second semiconductor fin, the fourth dummy gate being adjacent the second drain region, the second end of the second semiconductor fin being opposite the first end.

9. The method of claim 1, wherein the first recess has a third width and the second recess has a fourth width, the third width being larger than the fourth width.

10. A method comprising:
forming a first plurality of fins extending above a substrate, the first plurality of fins having first longitudinal axes;
epitaxially growing a first source region in first recesses in the first plurality of fins, the first source region being a common source region for the first plurality of fins, the first source region having a first width measured in a direction parallel to the first longitudinal axes, the first source region having a top surface above top surfaces of the first plurality of fins;
epitaxially growing a first drain region in second recesses in the first plurality of fins, the first drain region being a common drain region for the first plurality of fins, the first drain region having a second width measured in a direction parallel to the first longitudinal axes, the first width being larger than the second width, the first drain region having a top surface above top surfaces of the first plurality of fins;
forming a first active gate over the first plurality of fins, the first active gate being laterally between the first source region and the first drain region;
forming a second active gate over the first plurality of fins, the first source region being laterally between the first active gate and the second active gate, the first active gate and the second active gate being separated by a first distance measured in a direction parallel to the first longitudinal axes; and
forming a third active gate over the first plurality of fins, the first drain region being laterally between the first active gate and the third active gate, the first active gate and the second active gate being separated by a second distance measured in a direction parallel to the first longitudinal axes, the first distance being larger than the second distance.

11. The method of claim 10 further comprising:
forming a first source contact over and electrically coupled to the first source region, the first source contact having a third width; and
forming a first drain contact over and electrically coupled to the first drain region, the first drain contact having a fourth width, the fourth width being smaller than the third width.

12. The method of claim 10 further comprising:
forming a first dummy gate structure on a top surfaces and sidewalls of first ends of the first plurality of fins; and
forming a second dummy gate structure on a top surfaces and sidewalls of second ends of the first plurality of fins, the second ends being opposite the first ends.

13. The method of claim 12 further comprising:
forming gate spacers on sidewalls of the first and second dummy gate structures.

14. The method of claim 10, wherein the first width is from about 1.2 to about 5 times larger than the second width.

15. The method of claim 10 further comprising:
forming a second plurality of fins extending above the substrate, the second plurality of fins being parallel to the first plurality of fins;

forming a second source region on the second plurality of fins, the second source region having the first width; and
forming a second drain region on the second plurality of fins, the second drain region having the second width.

16. The method of claim 15 further comprising:
forming a second source contact over and electrically coupled to the second source region, the second source contact having a third width; and
forming a second drain contact over and electrically coupled to the second drain region, the second drain contact having a fourth width, the fourth width being smaller than the third width.

17. A device comprising:
a first epitaxial source region in a first semiconductor fin and having a top surface extending above a top surface of the first semiconductor fin, the first epitaxial source region having a first width;
a first epitaxial drain region in the first semiconductor fin and having a top surface extending above the top surface of the first semiconductor fin, the first epitaxial drain region having a second width, the second width being different than the first width;
a first active gate over the first semiconductor fin, the first active gate being laterally between the first epitaxial source region and the first epitaxial drain region;
a first channel region in the first semiconductor fin below the first active gate and between the first epitaxial source region and the first epitaxial drain region, the first channel region being doped with impurities of a first conductivity type;
a first dummy gate on the top surface and sidewalls of the first semiconductor fin, the first dummy gate being on a first end of the first semiconductor fin adjacent the first epitaxial source region, the first dummy gate and the first active gate being separated by a first distance; and
a second dummy gate on the top surface and sidewalls of the first semiconductor fin, the second dummy gate being on a second end of the first semiconductor fin adjacent the first epitaxial drain region, the second end of the first semiconductor fin being opposite the first end, the second dummy gate and the first active gate being separated by a second distance, the second distance being different than the first distance.

18. The device of claim 17, wherein the first width is larger than the second width.

19. The device of claim 17 further comprising:
a first source contact over and electrically coupled to the first epitaxial source region, the first source contact having a third width; and
a first drain contact over and electrically coupled to the first epitaxial drain region, the first drain contact having a fourth width, the fourth width being different than the third width.

20. The device of claim 17, wherein the first distance is larger than the second distance.

* * * * *